(12) United States Patent
Winegarden et al.

(10) Patent No.: US 6,691,266 B1
(45) Date of Patent: Feb. 10, 2004

(54) BUS MASTERING DEBUGGING SYSTEM FOR INTEGRATED CIRCUITS

(75) Inventors: Steven P. Winegarden, Sunnyvale, CA (US); Arye Ziklik, Sunnyvale, CA (US); Steven K. Knapp, Aptos, CA (US)

(73) Assignee: Triscend Corporation, Mountain View, CA (US)

( * ) Notice: Subject to any disclaimer, the term of this patent is extended or adjusted under 35 U.S.C. 154(b) by 0 days.

(21) Appl. No.: 09/418,948

(22) Filed: Oct. 15, 1999

(51) Int. Cl.⁷ .............................................. G01R 31/28
(52) U.S. Cl. ..................... 714/724; 714/29; 714/30; 717/124; 717/134
(58) Field of Search .................... 714/724, 29, 734, 714/736, 27, 25, 30, 31, 32, 727, 733, 741; 324/73.1, 158.1; 717/124, 134; 710/104, 110

(56) References Cited

U.S. PATENT DOCUMENTS

| | | | |
|---|---|---|---|
| 5,012,180 A | * | 4/1991 | Dalrymple et al. ........ 324/73.1 |
| 5,047,926 A | * | 9/1991 | Kuo et al. .................... 714/29 |
| 5,402,014 A | | 3/1995 | Ziklik et al. .................. 326/37 |
| 5,592,102 A | | 1/1997 | Lane et al. .................... 326/10 |
| 6,425,101 B1 | * | 7/2002 | Garreau ...................... 714/727 |
| 6,467,009 B1 | | 10/2002 | Winegarden et al. ........ 710/305 |

OTHER PUBLICATIONS

IBM Techical Disclosure Bulletin, "Efficient Mechanism for Multiple Debug Modes" vol. 38, No. 11, Nov. 1995.

* cited by examiner

*Primary Examiner*—Emmanuel L. Moise
(74) *Attorney, Agent, or Firm*—Blakely, Sokoloff, Taylor & Zafman LLP

(57) ABSTRACT

An integrated circuit includes a debugging unit which uses a multi-master general purpose bus within the IC to perform debugging functions. The storage elements of the IC are mapped into the address space of the general purpose bus. The debugging unit can operate as a bus master and read from or write to the storage elements of the integrated circuit directly with the general purpose bus. Thus, the integrated circuit can be rapidly configured for testing and debugging. Furthermore, the debugging unit can work with a breakpoint unit on the IC to detect and analyze specific situations on the IC.

19 Claims, 7 Drawing Sheets

BUS MASTERING DEBUGGING SYSTEM FOR INTEGRATED CIRCUITS

BACKGROUND OF THE INVENTION

1. Field of the Invention

The present invention relates to debugging units of integrated circuits (ICs). More specifically, the present invention relates to debugging units, which can act as bus masters to better control various elements of an integrated circuit.

2. Discussion of Related Art

Due to advancing semiconductor processing technology, integrated circuits (ICs) have greatly increased in functionality and complexity. For example, circuits and systems, which once required several ICs, are being combined into a single IC. However, with the increasing functionality of ICs, testing and debugging of ICs becomes increasingly difficult.

FIG. 1 is a simplified schematic diagram of a conventional integrated circuit (IC) 110 coupled to an external controller 105. IC 110 includes a JTAG interface 120 coupled to functional blocks 130 and 140. JTAG interface 120 is an industry standard serial interface (IEEE Std 1149.1).

Typically, external controller 105 uses JTAG interface 120 to retrieve state information in IC 110. Typically, the storage units, e.g. flip-flops, of IC 110 are connected in a serial scan chain so that the output terminal of a storage element is coupled to the input terminal of the next storage element in the serial scan chain. JTAG interface 120 can serially retrieve the logic level stored in each of the storage elements of IC 110 by clocking the serial scan chain of storage elements and reading the last storage element of the serial scan chain. JTAG interface 120 provides the retrieved information to external controller 105. In some versions if IC 110, JTAG interface 120 can also serially write data into the storage elements of IC 110. Thus, external controller 105 can configure the storage elements of IC 110 to set up specific test conditions to debug IC 110. However, because the storage elements are serially chained together, JTAG interface 120 serially writes data to every storage element even if the logic level stored in only one storage element needs to be changed.

As explained above, ICs are becoming increasingly complex and therefore the number of storage elements within ICs is rapidly increasing. With such large numbers of storage elements, using serial scan chains for debugging becomes costly due to the overhead required to couple all the registers to the scan chain and the overhead. Hence, there is a need for a method or structure to rapidly write and read information into the storage elements of an IC for debugging the IC.

SUMMARY

Accordingly, the present invention includes a debugging unit which uses a multi-master general purpose bus within an IC to read from and write to storage elements within the IC. Specifically, the storage elements of the IC are mapped into the address space of the general purpose bus. The debugging unit can operate as a bus master and read from or write to the storage elements of the integrated circuit directly. Thus, the integrated circuit can be rapidly configured for testing and debugging.

In some embodiments of the present invention, the bus master device is created using freezeable storage elements in place of conventional storage elements. By driving a freeze signal to an active logic level, the debugging unit can freeze the state of the bus master device, which allows debugging of the storage elements of the bus master device. Some embodiments of the present invention includes break point units which can be configured to freeze devices in the IC, including the bus master device as well as other bus devices in the IC. In one embodiment the breakpoint unit uses a clock control circuit to neutralize a clock signal to the devices to freeze the device. The breakpoint unit is also coupled to the general purpose bus and can be configured by the debugging unit. The present invention will be more fully understood in view of the following description and drawings.

DETAILED DESCRIPTION

Figure 1:
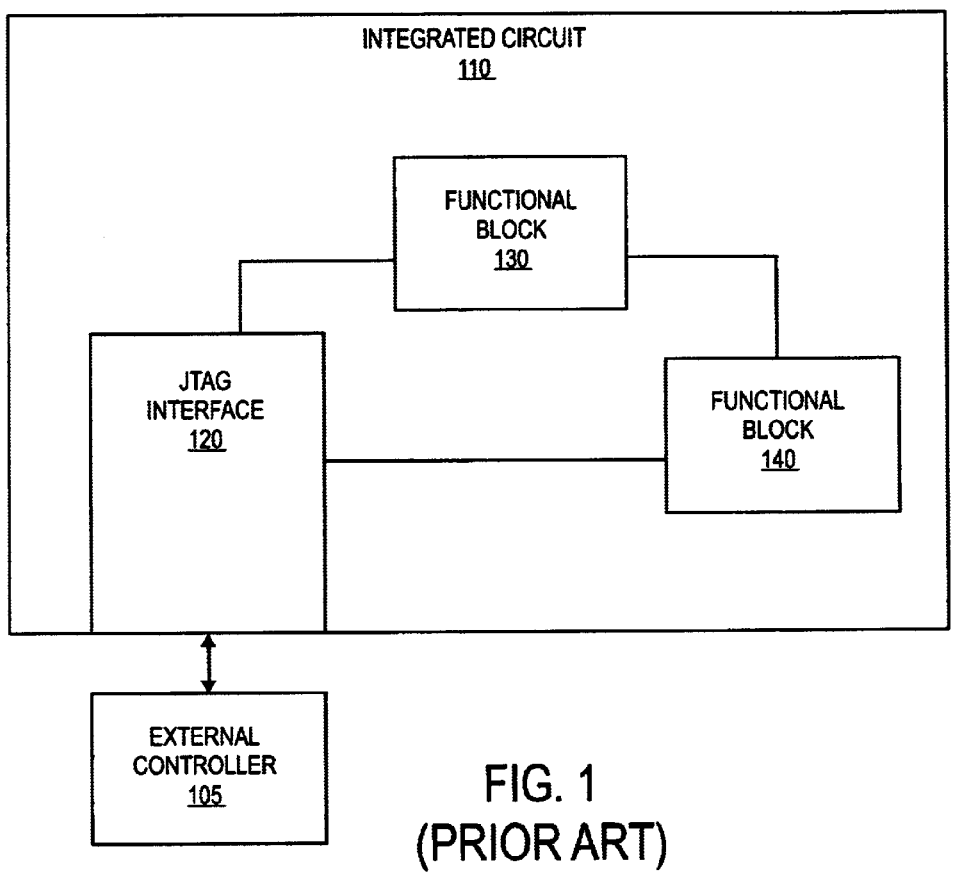
FIG. 1 is a simplified block diagram of a conventional IC coupled to an external controller.
Figure 2:
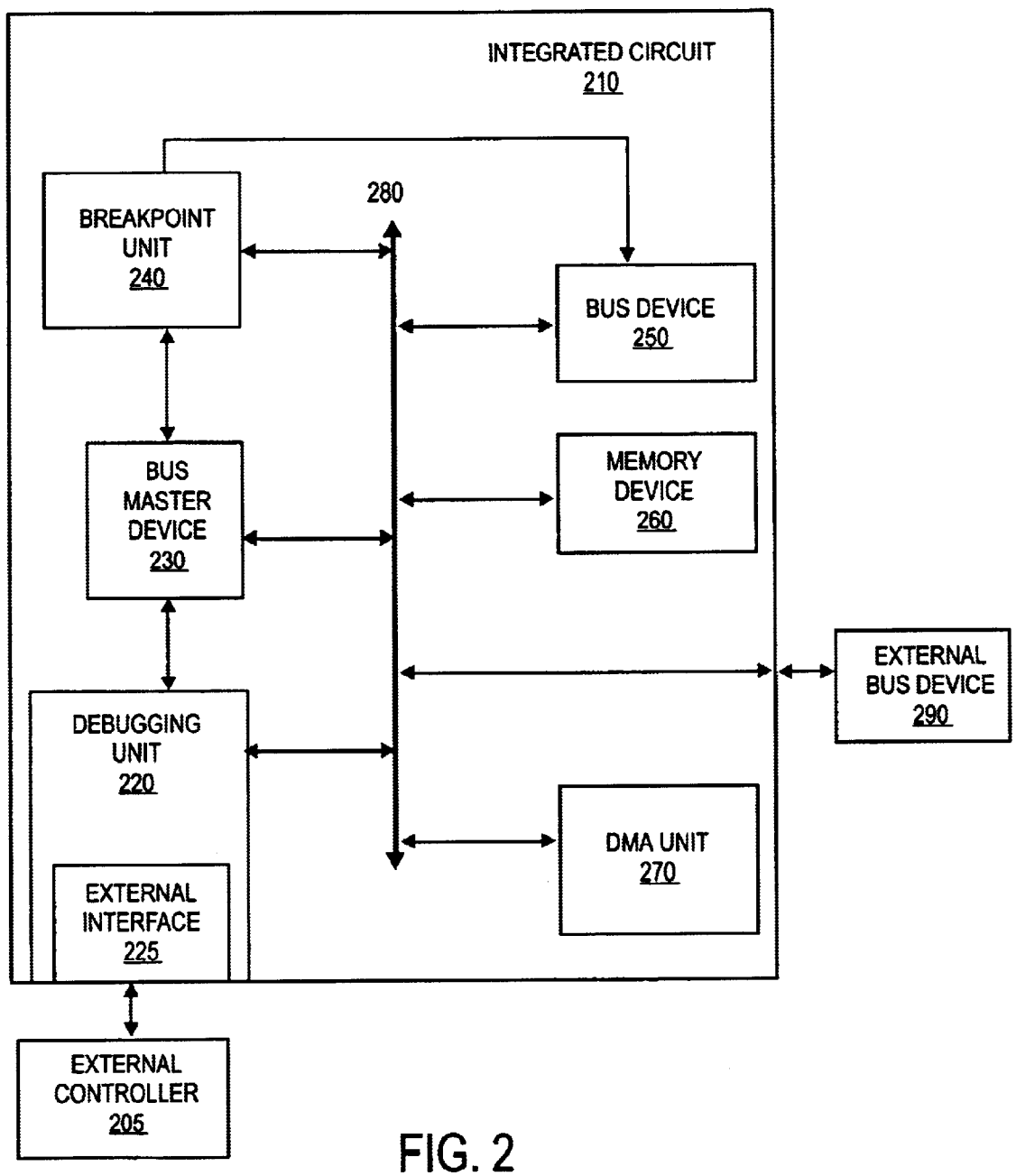
FIG. 2 is a block diagram of an IC in accordance with one embodiment of the invention coupled to an external controller.

FIG. 2 is a block diagram of an integrated circuit (IC) 210 in accordance with one embodiment of the present invention. IC 210 includes a debugging unit 220, a bus master device 230, a breakpoint unit 240, a general purpose bus 280, a bus device 250, a memory device 260, and a DMA unit 270. IC 210 is coupled to an external bus device 290 and an external controller 205. Specifically, external bus device 290 is coupled to general purpose bus 280 and external controller 205 is coupled to an external interface 225 of debugging unit 220. External interface 225 can be any of a variety of industry standard interfaces, such as JTAG, $I^2C$, or UART. Alternatively, any proprietary interfaces can also be used so long as external interface 225 provides a means to transfer data into and out of IC 210. Although only one bus master device 230 is shown in FIG. 2, some embodiments of the present invention can include multiple bus master devices. Similarly, some embodiments of the present invention can include multiple bus devices and memory devices.

Figure 3:
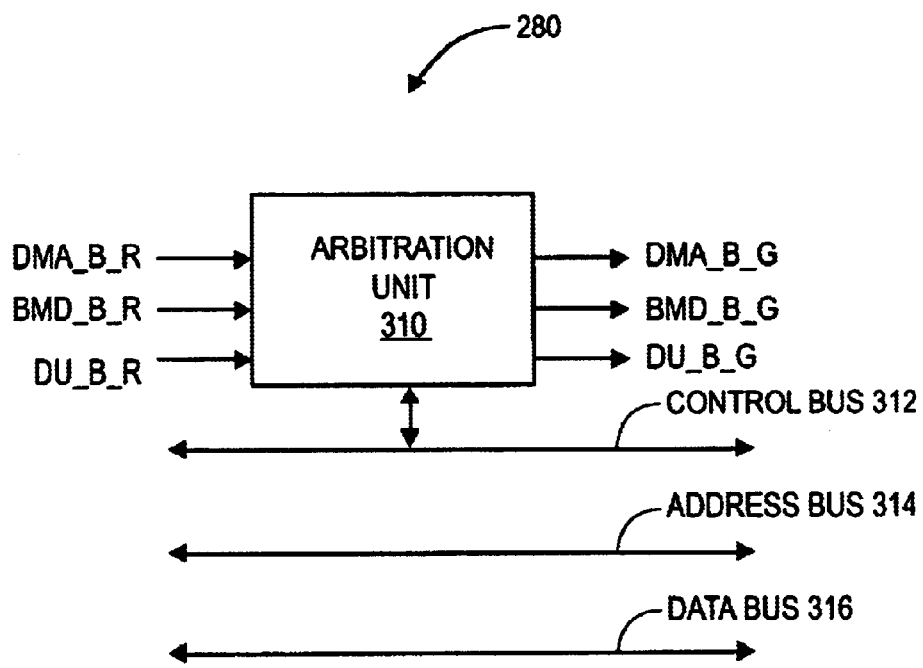
FIG. 3 is a block diagram of a general purpose bus in accordance with one embodiment of the invention.

General purpose bus 280 is coupled to debugging unit 220, bus master device 230, breakpoint unit 240, bus device 250, memory device 260, and DMA unit 270. The present invention can be used with a large variety of different types of general purpose busses. The various storage elements (e.g. registers, flip-flops, memory cells) of the devices and units in IC 210 are mapped into the address space of general purpose bus 280. Thus, bus masters on general purpose bus 280 can read from and write to the storage elements of IC 210, which are coupled to general purpose bus 280. As shown in FIG. 3, one embodiment of general purpose bus 280 includes an arbitration unit 310, a control bus 312, an address bus 314, and a data bus 316. Typically, devices coupled to general bus 280 are coupled to control bus 312, address bus 314, and data bus 316. Arbitration unit 310 receives bus request signals and drives bus grant signals to potential bus masters. For example in FIG. 3, arbitration unit 310 receives a bus master device bus request signal BMD_B_R from bus master device 230, a debugging unit bus request signal DU_B_R from debugging unit 220, and a DMA bus request signal DMA_B_R from DMA unit 270. Arbitration unit 310 then drives bus master device bus grant signal BMD_B_G to bus master device 230, debugging unit bus grant signal DU_B_G to debugging unit 220, and DMA bus grant signal DMA_B_G to DMA unit 270.

Depending on the specific embodiment of IC 210 (FIG. 2), bus master device 230 may be, for example, a microprocessor core, a digital signal processing core, compression/decompression unit or graphics processing engine. For debugging purposes, bus master device 230 is coupled to breakpoint unit 240 and debugging unit 220 so that both breakpoint unit 240 and debugging unit 220 can freeze bus master device 230. The process of freezing bus master device 230 is explained in detail below. Breakpoint unit 240 can be configured to detect certain situations on one or more signal lines. When a specific situation is detected, breakpoint unit 240 can freeze bus master device 230 and/or freeze bus device 250 so that external controller 205 can analyze the functionality of bus master device 230 and/or bus device 250 using debugging unit 220. Breakpoint units are well known in the art and thus are not discussed in further detail. However, some embodiments of the present invention use a novel freezing circuit which are described below in detail.

Bus device 250 can be, for example, a programmable logic device, a peripheral port device, or a data conversion device. In a specific embodiment of IC 210, bus device 250 is a field programmable gate array (FPGA) having configuration memories and configurable logic circuits. Both the configuration memory and the storage elements of the configurable logic circuits are mapped into the address space of general purpose bus 280. Thus, a bus master can read from and write to both the configuration memories of the FPGA as well as the storage elements within the configurable logic circuits. For further flexibility and versatility, some embodiments of the present invention use multiple clock signals with bus device 250.

Memory device 260 is generally used as random access memory for the other devices on general purpose bus 280. DMA unit 270 performs standard DMA operations. Generally, DMA unit 270 operates as a bus slave device while being configured and operates as a bus master device to carry out the actual DMA data transfer. For example, debugging unit 220 operating as a bus master can configure DMA unit 270 to perform a DMA transfer from memory device 260 to bus device 250. DMA unit 270 then operates as a bus master to actually carry out the DMA transfer. DMA units are well known in the art, thus details of DMA unit 270 are not discussed herein.

In accordance with one embodiment of the present invention, debugging unit 220 can operate as a bus master on general purpose bus 280. As explained above the storage elements on IC 210 are mapped into the address space of general purpose bus 280. Therefore, debugging unit 220 can read or write specific storage elements of IC 210. Thus, external controller 205 which is coupled to debugging unit 220 at external interface 225 can easily read the relevant information from IC 210. Furthermore, external controller 205 can easily control and observe states in IC 210 by writing or reading data to specific storage elements in IC 210.

During debugging, it is desirable to freeze the various circuits of IC 210 so that debugging unit 220 can read a "snapshot" of IC 210 for external controller 205. Both debugging unit 220 and breakpoint unit 240 can freeze bus master device 230. Furthermore, breakpoint unit 240 can also freeze bus device 250. In embodiments of IC 210 with multiple bus master devices or multiple bus devices, each bus master device and each bus device can be individually frozen. In one embodiment of the present invention, portions of IC 210 are frozen by neutralizing the clock signal for the portions to be frozen. For example, if breakpoint unit 240 detects a condition for freezing bus device 250, breakpoint unit 240 can freeze bus device 250 by neutralizing the clock signal for bus device 250. As stated above, in some embodiments of the present invention, multiple clock lines are provided to bus device 250. For these embodiments, breakpoint unit 240 can be configured to either neutralize all the clock signals or only a subset of the clock signals.

Figure 4:
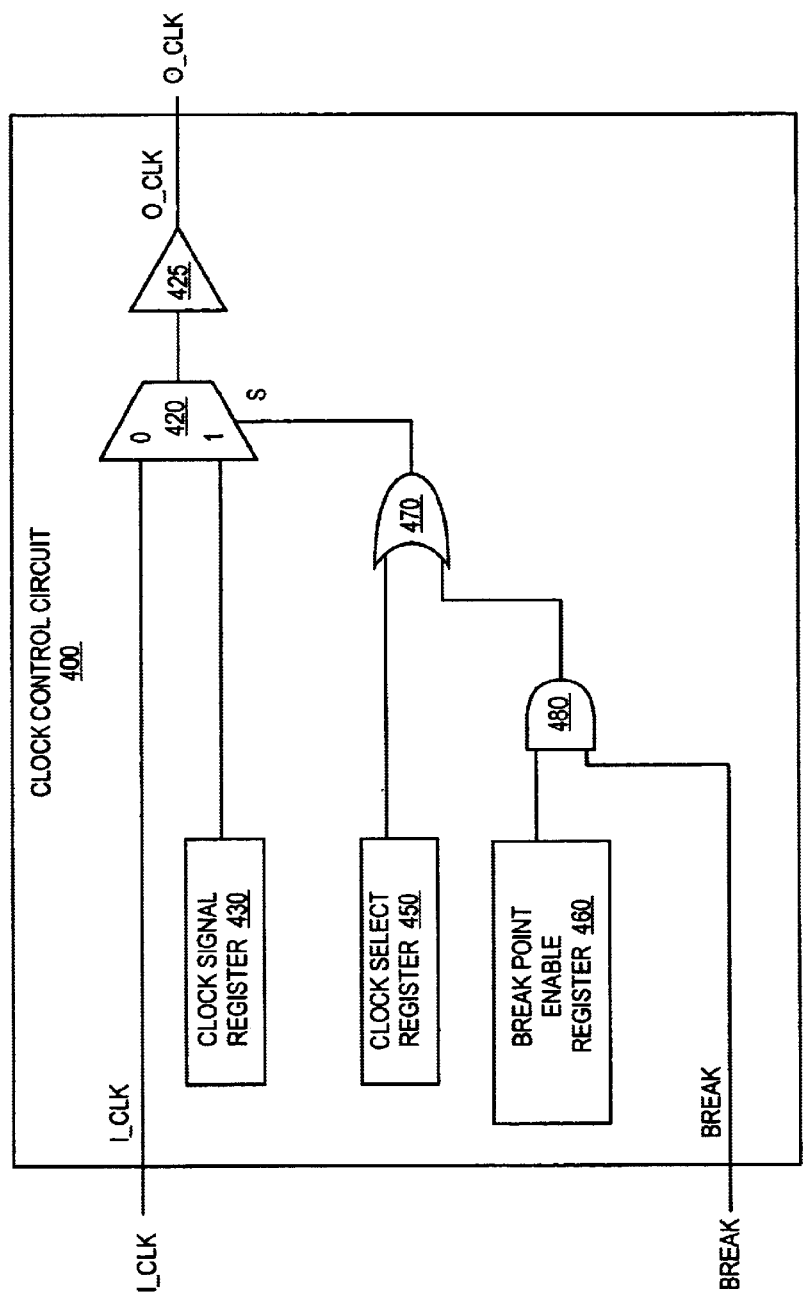
FIG. 4 is a schematic diagram of a clock stopping circuit in accordance with one embodiment of the present invention.

FIG. 4 is a schematic diagram of a clock control circuit 400 that can be used with breakpoint unit 240 and debugging unit 220 to selectively neutralize a clock line. Clock control circuit 400 includes a multiplexer 420, a clock buffer 425, a clock signal register 430, a clock select register 450, a breakpoint enable register 460, a logic OR gate 470 and a logic AND gate 480. For clarity, the control lines of the registers in clock control circuit 400 have been omitted in FIG. 4. In most embodiments of IC 210 using clock control circuit 400, the registers of clock control circuit 400 are mapped into the address space of general purpose bus 280. Thus, any bus mastering device on general purpose bus 280 can control the registers of clock control circuit 400. Although the embodiment of FIG. 4 uses a logic AND gate and a logic OR gate, one skilled in the art can adapt the principles of the present invention to construct clock control circuits using other types of logic gates.

Clock control circuit 400 receives an input clock signal I_CLK on the logic 0 input terminal of multiplexer 420. Clock control circuit 400 also receives a break signal BRK on an input terminal of logic AND gate 480. Clock control circuit drives an output clock signal O_CLK on the output terminal of clock buffer 425.

IF a logic 0 is applied to select terminal S of multiplexer 420, clock input signal I_CLK is applied to the input terminal of clock buffer 425. Thus, clock buffer 425 drives a copy of input clock signal I_CLK as output clock signal O_CLK. The output terminal of clock signal register 430 is coupled to the logic 1 input terminal of multiplexer 420. If a logic 1 is applied to select terminal S of multiplexer 420, the logic level stored in clock signal register 430 is applied to the input terminal of clock buffer 425. Thus, clock buffer 425 drives a copy of the logic level stored in clock signal register 430 as output clock signal O_CLK.

Select terminal S of multiplexer 420 is coupled to the output terminal of logic OR gate 470. A first input 1I terminal of logic OR gate 450 is coupled to the output terminal of clock select register 450. Thus, if clock select register 450 contains a logic 1, logic OR gate 470 applies a logic 1 on select terminal S of multiplexer 420. Therefore, output clock signal O_CLK is driven to the logic level stored in clock signal register 430. If clock select register 450 stores a logic 0, the logic level of the signal on select terminal S of multiplexer 420 is determined by the output signal of logic AND gate 480. A first input terminal of logic AND gate 480 is coupled to breakpoint enable register 460. If breakpoint enable register contains a logic 0, logic AND gate 480 drives a logic 0 regardless of the logic level of break signal BRK. However, if breakpoint enable register contains a logic 1, the output signal of logic AND gate 480 is equal to break signal BRK. Table 1 summarizes the functionality of clock control circuit 400 in truth table form:

TABLE 1

| CLOCK SEL. REGISTER | BREAKPOINT ENABLE REG. | BREAK SIG. | BRK O CLK |
|---|---|---|---|
| 0 | 0 | 0 | I_CLK |
| 0 | 0 | 1 | I_CLK |
| 0 | 1 | 0 | I_CLK |
| 0 | 1 | 1 | CLOCK SIGNAL REG. |
| 1 | 0 | 0 | CLOCK SIGNAL REG. |
| 1 | 0 | 1 | CLOCK SIGNAL REG. |
| 1 | 1 | 0 | CLOCK SIGNAL REG. |
| 1 | 1 | 1 | CLOCK SIGNAL REG. |

To avoid unintentional clock edges during a clock freeze operation, clock signal register 430 should be configured with a logic 0 for clocks signals using rising edges as active clock edges. Conversely, clock signal register 430 should be configured with a logic 1 for clock signals using falling edges as active edges.

Another benefit provided by clock control circuit 400 is the ability to provide controlled clock edges on output clock signal O_CLK. Specifically, when the signal on select terminal S is at logic 1, the logic level stored in clock signal register 430 is driven by output buffer 425 as output clock signal O_CLK. However, clock signal register 430 can be programmed from general purpose bus 280. Therefore, a bus master, such as debugging unit 220, on general purpose bus 280 can change the logic level stored in clock signal register 430 to create clock edges on output clock signal O_CLK. Thus, by using clock control circuit 400 breakpoint unit 240 and debugging unit 220 can selectively freeze various circuits in IC 210 by controlling the clock signals provided to the circuits.

Figure 5:
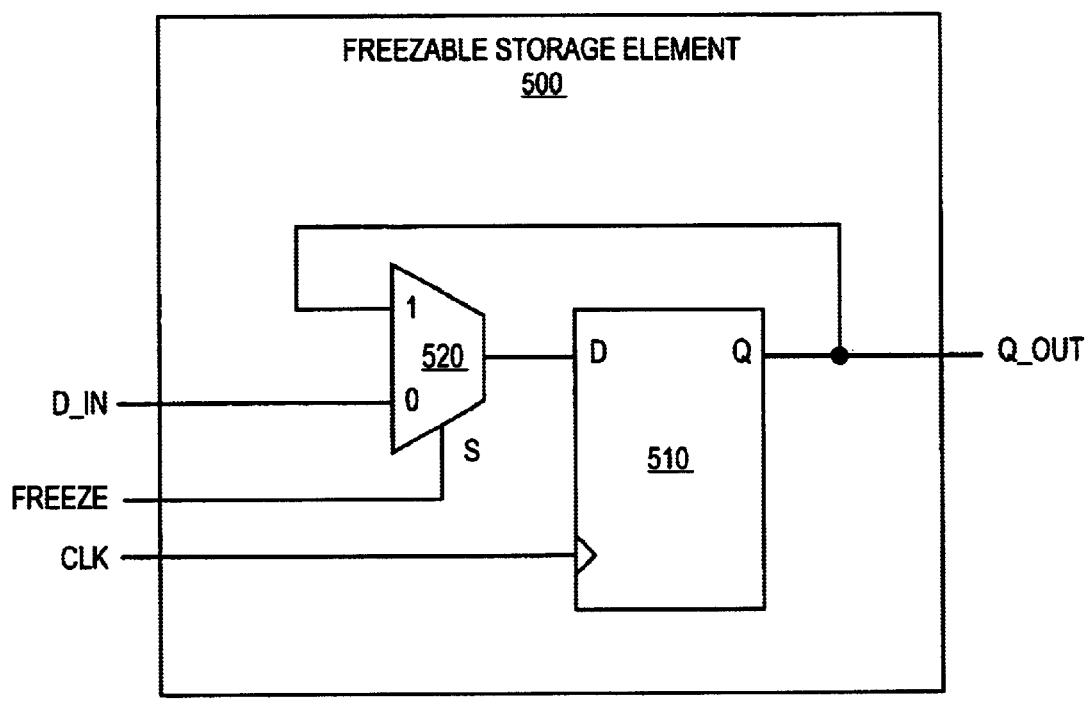
FIG. 5 is a block diagram of a freezeable storage element in accordance with one embodiment of the present invention.

Another method to freeze a portion of IC 210 is to replace conventional storage elements with freezeable storage elements. A freezeable storage element is a storage element that can be selectively disabled so that the value in the storage element is held constant. FIG. 5. is a schematic diagram of a freezeable storage element 500, which includes a D-type flip-flop 510 and a multiplexer 520. Freezeable storage element 500 receives a data input signal D_IN, a freeze signal FREEZE, and a clock signal CLK. Freezeable storage element 500 drives a data output signal Q_OUT. Specifically, clock input signal CLK is applied to the clock input terminal of D-type flip-flop 510. Data input signal D_IN is applied to the logic 0 input terminal of multiplexer 520. Freeze signal FREEZE is applied to the select terminal S of multiplexer 520. The output terminal of multiplexer 520 is coupled to the input terminal of D-type flip-flop 510. Thus, if freeze signal FREE is at logic 0, data input signal D_IN is applied to the data input terminal of D-type flip-flop 510. Therefore, if freeze signal FREEZE is at logic 0, freezeable storage element 300 behaves as an ordinary D-type flip-flop.

Output signal Q_OUT is driven by the output terminal of D-type flip flop 510, which is coupled to the logic 1 input terminal of multiplexer 520. Thus, if freeze signal FREEZE is in the logic 1 state, output terminal Q of D-type flip-flop 510 is coupled to input terminal D of D-type flip-flop 510 through multiplexer 520. Therefore, if freeze signal FREEZE is in the logic 1 state, the content of D-type flip flop 510 does not change.

In one embodiment of the present invention, bus master device 230 is a microprocessor core, in which conventional storage elements are replaced with freezeable storage elements. Both debugging unit 220 and breakpoint unit 240 can freeze the microprocessor core by asserting freeze signal FREEZE to logic 1.

Due to the flexibility and convenience of using a debugging unit with a general purpose bus many novel and powerful debugging techniques become possible. For clarity, examples of these debugging techniques are explained using integrated circuit (IC) 610 of FIG. 6. IC 610 is a specific embodiment of IC 210 in which the bus master device is a microprocessor 630 and the bus device is an FPGA 650. The remaining components of IC 610 are the same as the components of IC 210 and retain the same reference numerals. IC 610 is a very versatile IC because microprocessor 630 can perform a variety of tasks using software stored in memory device 260 or external bus device 290. In addition, FPGA 650 gives the ability to create custom hardware for time critical calculations or for custom hardware interfaces. However, the versatility of IC 610 also creates many difficult debugging issues since bugs could exist in the software executed by microprocessor 630 or in the hardware configured in FPGA 650.

To increase software debugging flexibility, microprocessor 630 incorporates freezeable storage elements to allow freezing of microprocessor 630 by debugging unit 220 and/or breakpoint unit 240. In addition, both breakpoint unit 240 and debugging unit 220 are able to use interrupts on microprocessor 630. Furthermore, debugging unit 220 can reset microprocessor 630 to an initial power-on/reset state. Also, as explained above, the storage elements in microprocessor 630 are mapped into the address space of general purpose bus 280 and are therefore accessible by debugging unit 220.

To increase hardware debugging flexibility, integrated circuit 610 includes clock control circuits (not shown), such as clock control circuit 400, to drive multiple clock lines to FPGA 650. Thus, the clock signals to FPGA 650 can be neutralized by either breakpoint unit 240 or debugging unit 220. Also, as explained above, the configurable logic circuits as well as the configuration memories of FPGA 650 are mapped into the address space of general purpose bus 280 and are therefore accessible by debugging unit 220.

In one embodiment of the present invention, real time debugging is achieved by having debugging unit 220 monitor only the freeze signal from breakpoint unit 240. Thus, microprocessor 630 has full use of the resources of IC 610 without interference from debugging unit 220. Accordingly, microprocessor 630 is able to execute the program code in real time. When breakpoint unit 240 freezes microprocessor 630, debugging unit 220 can then be used by external controller 205 to observe IC 610.

Figure 7:
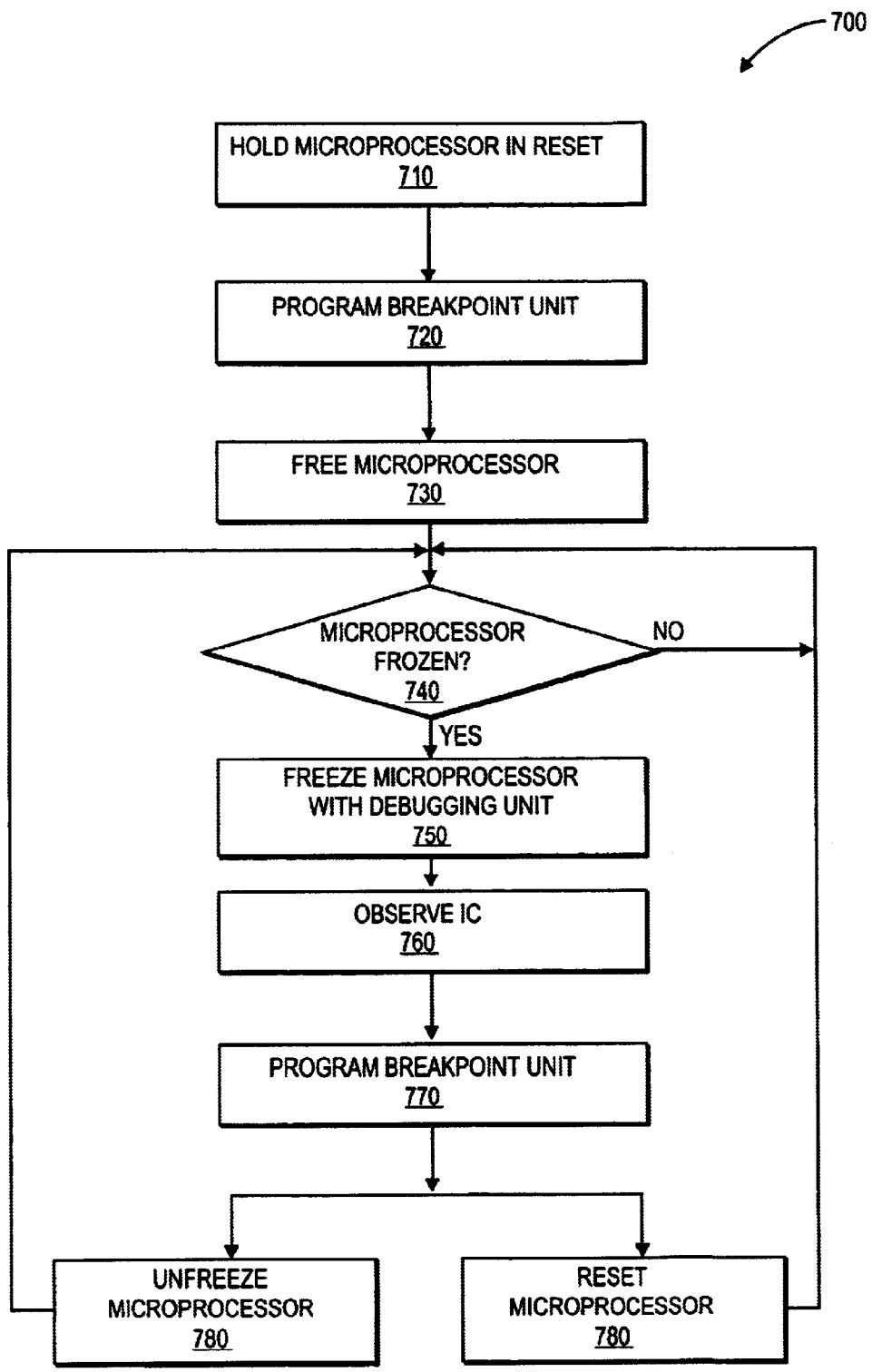
FIG. 7 is a flow diagram of a method of debugging in accordance with one embodiment of the present invention.

The process of using debugging unit 220 is illustrated in flowchart 700 of FIG. 7. First, debugging unit 220 holds microprocessor 630 in a reset state in HOLD MICROPROCESSOR IN RESET step 710. Then, debugging unit 220 programs breakpoint unit 240 with the conditions for breakpoint unit 240 to freeze microprocessor 630 in PROGRAM BREAKPOINT UNIT step 720. Microprocessor 630 is then released to begin processing in FREE MICRPROCESSOR step 730. Debugging unit 220 then waits for microprocessor 630 to be frozen by breakpoint unit 240 in MICROPROCESSOR FROZEN? step 740. When microprocessor 630 is frozen, debugging unit debugging unit 220 freezes microprocessor 630 in FREEZE MICROPROCESSOR WITH DEBUGGING UNIT step 750. After freezing microprocessor 630, debugging unit 220 can observer the state of IC 610 by operating as a bus master on general purpose bus 280 in OBSERVE IC step 760. Because microprocessor 630 is frozen by breakpoint unit 240, OBSERVE IC step 760 and FREEZE MICROPROCESSOR WITH DEBUGGING UNIT step 750 can be switched in order.

Then, in PROGRAM BREAKPOINT UNIT step 770, debugging unit 220 uses general purpose bus 280 to program breakpoint unit 240 with the next breakpoint event. A useful breakpoint is to freeze microprocessor 630 when microprocessor 630 prefetches an instruction. By freezing microprocessor 630 whenever on instruction prefetches, microprocessor 630 can be observed after each instruction is executed. Thus, microprocessor 630 can be debugged using single stepping of microprocessor instructions.

After programming the next breakpoint, debugging unit 220 unfreezes microprocessor 630 in UNFREEZE MICROPROCESSOR step 780 if the next breakpoint event is not disturbed by the previous breakpoint. Otherwise, debugging unit 220 resets microprocessor 630 in RESET MICROPROCESSOR step 790. In either case, debugging unit 220 then waits until breakpoint unit 240 freezes microprocessor 630 in MICROPROCESSOR FROZEN? step 740.

Figure 6:
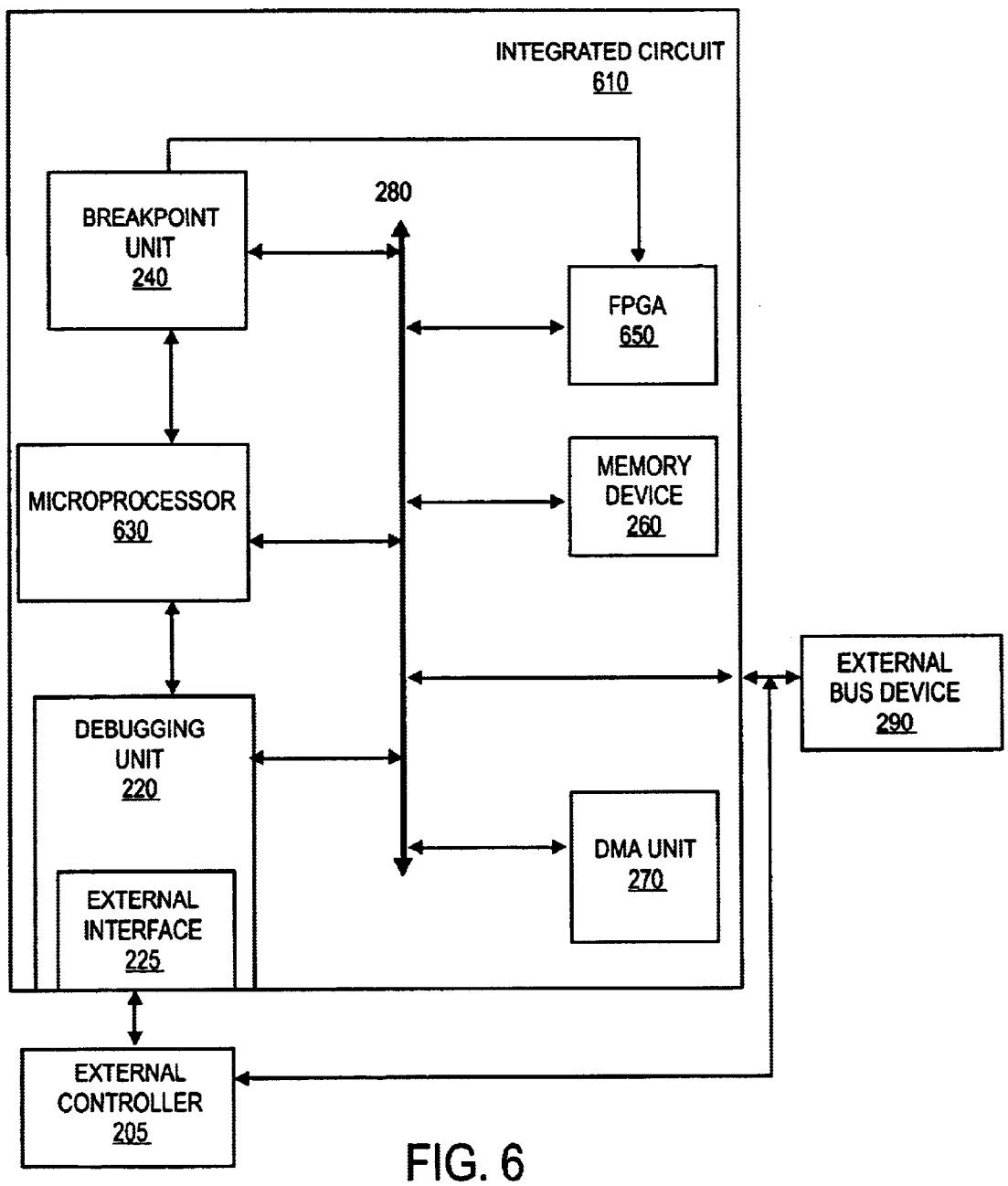
FIG. 6 is a block diagram of an IC in accordance with one embodiment of the present invention coupled to an external controller.

Another novel and powerful debugging method facilitates debugging FPGA 650. Specifically, since debugging unit 220 can reset microprocessor 630, debugging unit 220 can take advantage of the power of microprocessor 630 to reconfigure and test FPGA 650. Specifically, debugging unit 220 can store a program in memory device 260 to be executed by microprocessor 630 upon reset of microprocessor 630. Various programs can be created to configure and test possible configurations of FPGA 650 until a final configuration is reached. As shown in FIG. 6, external controller 205 can also be coupled to external bus device 290 (or even directly to general purpose bus 280) to provide the program and to retrieve information at a more rapid rate than possible with external interface 225.

In the various embodiments of this invention, methods and structures have been described to debug integrated circuits. A debugging unit coupled to a general purpose bus able to address the storage elements of the IC allows novel and powerful debugging methods. Thus, the cost and time for creating complex ICs is reduced.

The various embodiments of the structures and methods of this invention that are described above are illustrative only of the principles of this invention and are not intended to limit the scope of the invention to the particular embodiments described. For example, in view of this disclosure, those skilled in the art can define other debugging units, microprocessors, clock control circuits, storage elements, busses, FPGAs, breakpoint units, and so forth, and use these alternative features to create a method, circuit, or system according to the principles of this invention. Thus, the invention is limited only by the following claims.

What is claimed is:

1. An integrated circuit comprising:
   a general purpose bus;
   a bus master device coupled to the general purpose bus;
   a debugging unit coupled to the general purpose bus, wherein the debugging unit is configurable to operate as a bus master of the general purpose bus.

2. The integrated circuit of claim 1, wherein the bus master device is a microprocessor.

3. The integrated circuit of claim 1, wherein the bus master device comprises a plurality of freezeable storage elements coupled to the debugging unit.

4. The integrated circuit of claim 1, wherein the bus master devices comprises a plurality of storage elements mapped in an address space of the general purpose bus.

5. The integrated circuit of claim 4, wherein the debugging unit can read from and write to the plurality of storage elements.

6. The integrated circuit of claim 1, further comprising a bus device coupled to the general purpose bus.

7. The integrated circuit of claim 6, wherein the bus device is a field programmable gate array having configurable logic circuits and configuration memories.

8. The integrated of circuit claim 7, wherein the configuration memories are mapped in an address space of the general purpose bus.

9. The integrated circuit of claim 7, wherein the configurable logic circuits comprises a plurality of storage elements mapped in an address space of the general purpose bus.

10. The integrated circuit of claim 6, further comprising a breakpoint unit coupled to the general purpose bus, the bus master device, and the bus device, wherein the breakpoint unit can freeze the bus master device and the bus device.

11. The integrated circuit of claim 10, wherein the break point unit is coupled to the bus device through a clock control circuit.

12. The integrated circuit of claim 1, further comprising:
    a memory device coupled to the general purpose bus; and
    a DMA unit coupled to the general purpose bus.

13. A method of debugging an integrated circuit, the method comprising:
    freezing a bus master device within the integrated circuit;
    configuring a debugging unit within the integrated circuit to operate as a bus master on the general purpose bus; and
    reading storage elements of the integrated circuit using a general purpose bus within the integrated circuit.

14. The method of claim 13, further comprising programming a breakpoint unit to freeze the bus master device.

15. The method of claim 13, further comprising unfreezing the bus master device.

16. The method of claim 13, wherein the freezing the bus master device comprises neutralizing a clock signal to the bus master device.

17. The method of claim 13, wherein the freezing the bus master device comprises driving a freeze signal of a freezeable storage element to an active logic level.

18. The method of claim 13, further comprising freezing a bus device.

19. The method of claim 18, wherein the freezing a bus device comprises neutralizing a clock signal to the bus device.

* * * * *